(12) United States Patent
Ibara

(10) Patent No.: US 6,872,632 B2
(45) Date of Patent: Mar. 29, 2005

(54) METHOD OF FABRICATING SEMICONDUCTOR DEVICE

(75) Inventor: Yoshikazu Ibara, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/768,170

(22) Filed: Feb. 2, 2004

(65) Prior Publication Data

US 2004/0157406 A1 Aug. 12, 2004

(30) Foreign Application Priority Data

Feb. 7, 2003 (JP) ........................................ 2003-030463

(51) Int. Cl.[7] ............................................. H01L 21/76
(52) U.S. Cl. ...................... 438/427; 438/429; 438/692; 438/437
(58) Field of Search ................................ 438/427, 429, 438/424, 435, 437, 701, 692

(56) References Cited

U.S. PATENT DOCUMENTS 6,399,449 B1 * 6/2002 Matsumoto ................. 438/296
6,461,934 B2 * 10/2002 Nishida et al. .............. 438/424
2001/0036705 A1 * 11/2001 Nishida et al. .............. 438/296

FOREIGN PATENT DOCUMENTS

| JP | 4-81029 | 3/1992 |
| JP | 5-109880 | 4/1993 |
| JP | 9-8119 | 1/1997 |
| JP | P2000-49296 A | 2/2000 |

* cited by examiner

Primary Examiner—Caridad Everhart
(74) Attorney, Agent, or Firm—McDermott Will & Emery LLP

(57) ABSTRACT

A method of fabricating a semiconductor device capable of suppressing defective etching in formation of a deep trench also when the number of polishing steps is reduced is obtained. This method of fabricating a semiconductor device comprises steps of forming a first trench on an element isolation region of a semiconductor substrate, forming a first film consisting of an insulator film to fill up the first trench, forming a second trench larger in depth than the first trench in the first trench, forming an embedded film in the second trench and substantially simultaneously polishing an excess depositional portion of the first film and an excess depositional portion of the embedded film.

16 Claims, 10 Drawing Sheets

METHOD OF FABRICATING SEMICONDUCTOR DEVICE

TITLE OF THE INVENTION

Method of Fabricating Semiconductor Device

BACKGROUND OF THE INVENTION

1. Field of the Invention

The present invention relates to a method of fabricating a semiconductor device, and more particularly, it relates to a method of fabricating a semiconductor device having an element isolation region.

2. Description of the Background Art

In general, a method of forming a deep trench for isolating a high concentration impurity layer in a substrate in addition to element isolation through a field oxide film formed by a LOCOS (local oxidation of silicon) method is known as an element isolation technique for a semiconductor device such as a bipolar transistor. However, the field oxide film formed by the LOCOS method is disadvantageously inferior in surface flatness, and hard to refine due to increase of the area of an element isolation region resulting from a bird's beak.

In place of the LOCOS method, therefore, there has recently been proposed an element isolation technique employing STI (shallow trench isolation) presenting excellent flatness and allowing further refinement. For example, Japanese Patent Laying-Open No. 9-8119 (1997) discloses such an element isolation technique employing STI.

FIGS. 17 to 27 are sectional views for illustrating conventional fabrication processes for a semiconductor device including element isolation regions according to STI. The conventional fabrication processes for a semiconductor device are now described with reference to FIGS. 17 to 27.

As shown in FIG. 17, an N$^+$-type buried layer 102 is formed on the main surface of a P-type silicon substrate 101. An N-type epitaxial silicon layer 103 is formed on the N$^+$-type buried layer 102. A silicon oxide film (SiO$_2$ film) 104 is formed on the N-type epitaxial silicon layer 103 by thermal oxidation. An Si$_3$N$_4$ film 105 is formed on the silicon oxide film 104 for serving as a stopper film in a CMP (chemical mechanical polishing) step described later. A resist film 106 is formed on a prescribed region of the Si$_3$N$_4$ film 105.

Thereafter the resist film 106 is employed as a mask for dry-etching the Si$_3$N$_4$ film 105 and the silicon oxide film 104, and the epitaxial silicon layer 103 is thereafter partially etched thereby forming shallow trenches 120 to enclose the element forming region 150, as shown in FIG. 18. Thereafter the resist film 106 is removed.

As shown in FIG. 19, an HDP-NSG (high density plasma non-doped silicate glass) film 107 having an excellent embedding property is formed on the overall surface by high density plasma CVD (HDP-CVD). Thereafter the Si$_3$N$_4$ film 105 is employed as a stopper film for removing an excess depositional portion of the HDP-NSG film 107 by CMP, thereby forming HDP-NSG films 107 having flat upper surfaces embedded in the shallow trenches 120 as shown in FIG. 20.

As shown in FIG. 21, another Si$_3$N$_4$ film 108 is formed on the HDP-NSG films 107 and the Si$_3$N$_4$ film 105 for serving as a stopper film in another CMP step described later. A silicon oxide film (SiO$_2$ film) 109 is formed on the Si$_3$N$_4$ film 108 by CVD. Resist films 110 are formed on prescribed regions of the silicon oxide film 109.

As shown in FIG. 22, the resist films 110 are employed as masks for etching the silicon oxide film 109, the Si$_3$N$_4$ film 108 and the HDP-NSG films 107 thereby patterning the same. Thereafter the resist films 110 are removed for obtaining a shape shown in FIG. 23.

As shown in FIG. 24, the silicon oxide film 109 is employed as a hard mask for etching the n-type epitaxial silicon layer 103, the N$^+$-type buried layer 102 and the P-type silicon substrate 101, thereby forming deep trenches 130 for isolating the N$^+$-type buried layer 102. Thereafter the silicon oxide film 109 is removed thereby obtaining a shape shown in FIG. 25.

As shown in FIG. 26, a silicon oxide film (SiO$_2$ film) 111 is formed by CVD to fill up the deep trenches 130 while extending on the Si$_3$N$_4$ film 108. Thereafter the Si$_3$N$_4$ film 108 is employed as a stopper film for removing an excess depositional portion of the silicon oxide film 111 by CMP, followed by removal of the Si$_3$N$_4$ films 108 and 105 and the silicon oxide film 104. The surfaces of the HDP-NSG films 107 are also scraped when the silicon oxide film 104 is removed, whereby element isolation regions having flat upper surfaces are finally formed as shown in FIG. 27.

The element isolation regions employed for a conventional bipolar transistor (semiconductor device) are formed in the aforementioned manner. Thereafter the bipolar transistor (not shown) is formed on the element forming region 150.

In the conventional method of fabricating a semiconductor device including element isolation regions shown in FIGS. 17 to 27, however, the excess depositional portion of the HDP-NSG films 107 filling up the shallow trenches 120 and those of the silicon oxide films 111 filling up the deep trenches 130 are removed through different CMP steps respectively, disadvantageously leading to complicated fabrication processes. Further, the Si$_3$N$_4$ films 105 and 108 must be formed for serving as stopper films in the respective CMP steps, also disadvantageously leading to complicated fabrication processes. In addition, the fabrication cost is increased due to the two CMP steps requiring high unit costs.

SUMMARY OF THE INVENTION

An object of the present invention is to provide a method of fabricating a semiconductor device capable of simplifying fabrication processes and reducing the fabrication cost by reducing the number of polishing steps.

A method of fabricating a semiconductor device according to an aspect of the present invention comprises steps of forming a first trench on an element isolation region of a semiconductor substrate, forming a first film consisting of an insulator film to fill up the first trench, forming a second trench larger in depth than the first trench in the first trench, forming an embedded film in the second trench and substantially simultaneously polishing an excess depositional portion of the first film and an excess depositional portion of the embedded film.

In the method of fabricating a semiconductor device according to this aspect, as hereinabove described, the first film consisting of an insulator film is formed to fill up the first trench while the embedded film is formed in the second trench and the excess depositional portions of the first film and the embedded film are thereafter substantially simultaneously polished so that fabrication processes can be simplified as compared with a case of polishing the excess depositional portions of the first film and the embedded film in different steps respectively. Further, the polishing step may be carried out only once, whereby the fabrication cost can be reduced.

The method of fabricating a semiconductor device according to the aforementioned aspect preferably further comprises a step of forming a second film superior in coverage to the first film on the first film, and the step of forming the second trench preferably includes a step of etching the semiconductor substrate through the second film and the first film serving as masks thereby forming the second trench larger in depth than the first trench in the first trench. According to this structure, the second film can inhibit a portion of the first film close to a step portion of the surface of the semiconductor substrate from being scraped to expose the surface of the semiconductor substrate in the step of etching for forming the second trench also when the first film is inferior in coverage. Thus, a surface portion of the semiconductor substrate close to a step portion of the first film can be inhibited from etching in the step of forming the second trench. Consequently, defective etching can be suppressed in the step of etching for forming the second trench.

In the method of fabricating a semiconductor device including the aforementioned step of forming the second film, the second film is preferably an HTO film. According to this structure, a film excellent in coverage can be easily formed.

In the method of fabricating a semiconductor device including the aforementioned step of forming the second film, the step of forming the second trench preferably includes steps of forming a resist film on a prescribed region of the second film and thereafter patterning the second film and the first film through the resist film serving as a mask as well as removing the resist film and thereafter etching the semiconductor substrate through the patterned second film and the patterned first film serving as masks thereby forming the second trench larger in depth than the first trench in the first trench. According to this structure, the semiconductor substrate can be easily etched through the second and first films serving as masks.

In the method of fabricating a semiconductor device including the aforementioned step of removing the resist film and thereafter etching the semiconductor substrate through the patterned second film and the patterned first film serving as masks, the step of forming the second trench preferably includes a step of etching the semiconductor substrate while leaving the second film by a prescribed thickness thereby forming the second trench larger in depth than the first trench in the first trench. According to this structure, a portion of the first film close to a step portion of the surface of the semiconductor substrate can be easily inhibited from being scraped to expose the surface of the semiconductor substrate in the step of etching for forming the second trench.

In this case, the second film preferably has a thickness of at least 300 nm and not more than 500 nm. According to this structure, the second film having the thickness of at least 300 nm can be left by the prescribed thickness in the step of etching the semiconductor substrate. Further, the second film and the first film can be easily patterned due to the second film having the thickness of not more than 500 nm.

In the method of fabricating a semiconductor device including the aforementioned step of forming the second film, the step of forming the second trench preferably includes steps of forming a resist film on a prescribed region of the second film and thereafter patterning the second film and the first film through the resist film serving as a mask as well as etching the semiconductor substrate through the resist film, the patterned second film and the patterned first film serving as masks thereby forming the second trench larger in depth than the first trench in the first trench. When the second trench is formed in this manner, not only the first and second films but also the resist mask can be employed as masks in the step of etching the semiconductor substrate, whereby the thickness of the second film can be reduced.

In the method of fabricating a semiconductor device including the aforementioned step of forming the second film, the first film preferably is superior in embedding property to the second film. According to this structure, the first film can excellently fill up the first trench.

In the method of fabricating a semiconductor device according to the aforementioned aspect, the step of forming the first film preferably includes a step of forming the first film consisting of an insulator film by high density plasma CVD. According to this structure, the first film excellent in embedding property can be easily formed.

In the method of fabricating a semiconductor device including the aforementioned step of forming the second film, the step of forming the second film preferably includes a step of forming the second film superior in coverage to the first film by a method other than high density plasma CD. According to this structure, the second film superior in coverage to the first film can be easily formed by a method such as low pressure CVD or atmospheric pressure CVD, for example, other than high density plasma CVD.

In this case, the step of forming the second film may include a step of forming an HTO film by low pressure CVD.

The method of fabricating a semiconductor device according to the aforementioned aspect may further comprise a step of forming a first insulator film on the inner surface of the second trench in advance of the step of forming the embedded film in the second trench. According to this structure, a film consisting of a material other than an insulator can also be employed as the embedded film formed in the second trench.

In this case, the step of forming the embedded film in the second trench may include a step of forming a semiconductor film in the second trench formed with the first insulator film. Also when the semiconductor film is formed in the second trench, the first insulator film can insulate the semiconductor substrate and the semiconductor film from each other.

In the method of fabricating a semiconductor device including the aforementioned step of forming the first insulator film, the step of forming the first insulator film may include a step of forming the first insulator film by CVD. According to this structure, the shapes of first and second openings are not disadvantageously changed due to thermal oxidation dissimilarly to a case of forming the first insulator film by thermal oxidation.

The method of fabricating a semiconductor device according to the aforementioned aspect may further comprise a step of forming a second insulator film covering the element isolation region after the step of substantially simultaneously polishing the excess depositional portion of the first film and the excess depositional portion of the embedded film.

The method of fabricating a semiconductor device according to the aforementioned aspect may further comprise a step of forming a semiconductor element on an element forming region enclosed with the element isolation region.

The foregoing and other objects, features, aspects and advantages of the present invention will become more

DESCRIPTION OF THE PREFERRED EMBODIMENTS

An embodiment of the present invention is now described with reference to the drawings.

Fabrication processes for a semiconductor device including element isolation regions according to this embodiment are described with reference to FIGS. 1 to 11.

Figure 1:
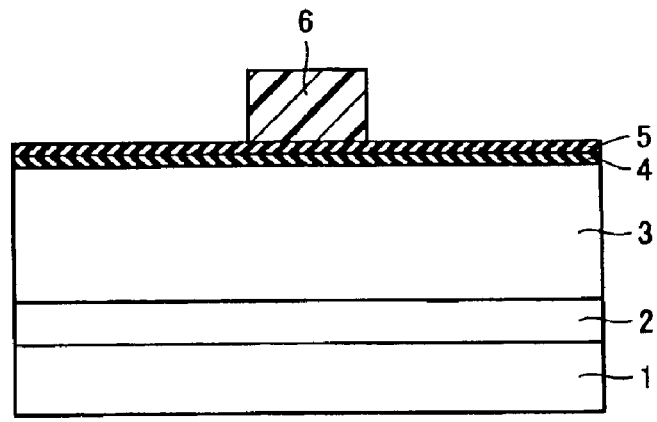
FIGS. 1 to 11 are sectional views for illustrating fabrication processes for a semiconductor device including element isolation regions according to an embodiment of the present invention.

As shown in FIG. 1, an N$^+$-type buried layer 2 is formed on the main surface of a P-type silicon substrate 1. An N-type epitaxial silicon layer 3 is formed on the N$^+$-type buried layer 2. The P-type silicon substrate 1, the N$^+$-type buried layer 2 and the N-type epitaxial silicon layer 3 are examples of the "semiconductor substrate" in the present invention. A silicon oxide film (SiO$_2$ film) 4 is formed on the N-type epitaxial silicon layer 3 by thermal oxidation with a thickness of about 100 nm. An Si$_3$N$_4$ film 5 is formed on the silicon oxide film 4 for serving as a stopper film in a CMP step. A resist film 6 is formed on a prescribed region of the Si$_3$N$_4$ film 5.

Figure 2:
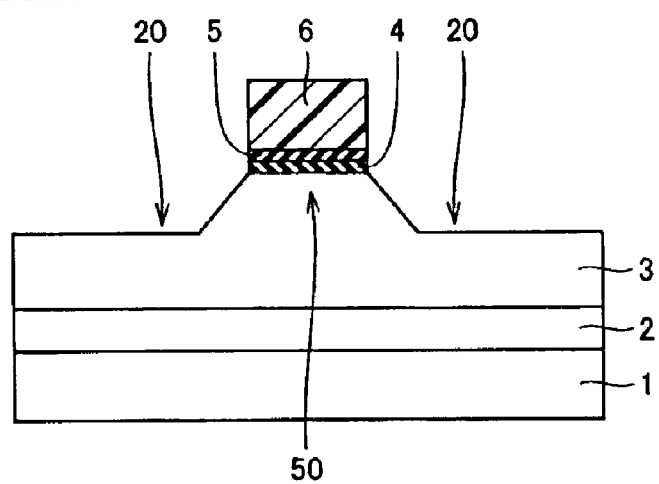

As shown in FIG. 2, the resist film 6 is employed as a mask for dry-etching the Si$_3$N$_4$ film 5 and the silicon oxide film 4, and the epitaxial silicon layer 3 is thereafter etched by a thickness of about 500 nm. Thus, shallow trenches 20 having a depth of about 500 nm are formed to enclose an element forming region 50. The shallow trenches 20 are examples of the "first trench" in the present invention. Thereafter the resist film 6 is removed.

Figure 3:
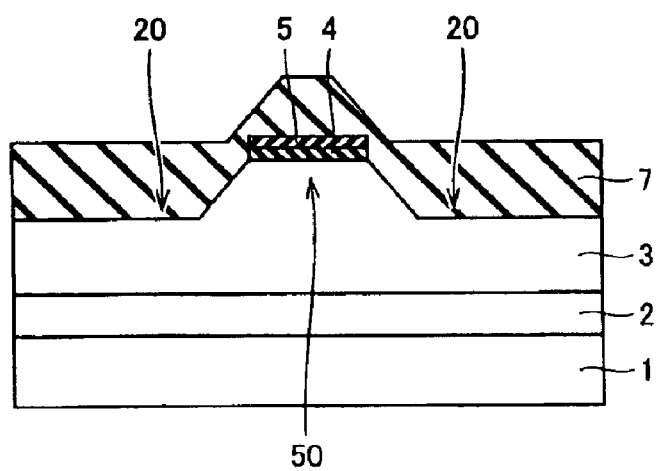

As shown in FIG. 3, an HDP-NSG film 7 is formed by high density plasma CVD (HDP-CVD) with a thickness of about 600 nm, to completely fill up the shallow trenches 20. In this state, the upper surface of the HDP-NSG film 7 is positioned higher than that of the element forming region 50 of the N-type epitaxial silicon layer 3.

Figure 4:
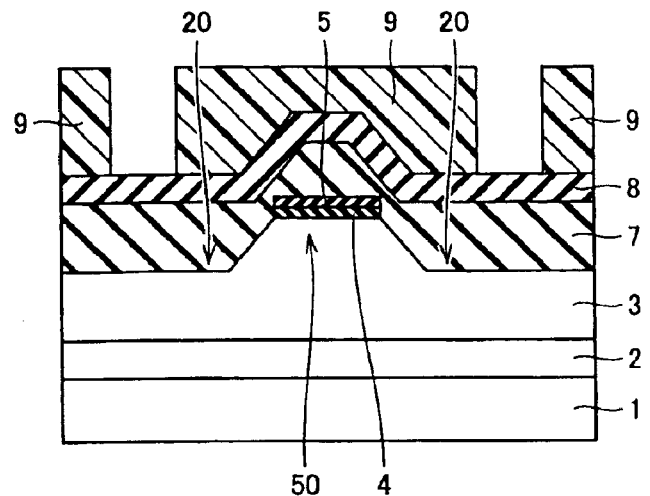

According to this embodiment, an HTO (high-temperature oxide) film 8 is formed on the HDP-NSG film 7 by low pressure CVD under a temperature condition of about 800° C. with a thickness of at least about 300 nm and not more than about 500 nm, as shown in FIG. 4. This HTO film 8 is superior in step coverage to the HDP-NSG film 7. On the other hand, the HDP-NSG film 7 is superior in embedding property to the HTO film 8. Therefore, the shallow trenches 20 can be excellently filled up with the HDP-NSG film 7. The HDP-NSG film 7 is an example of the "first film" in the present invention, and the HTO film 8 is an example of the "second film" in the present invention.

The HTO film 8 is formed with the thickness of at least about 300 nm since a problem of defective etching described later cannot be solved if the thickness of the HTO film 8 is smaller than about 300 nm. The HTO film 8 is formed with the thickness of not more than about 500 nm since it is difficult to pattern the HTO film 8 and the HDP-NSG film 7 if the thickness of the HTO film 8 exceeds about 500 nm. After the aforementioned formation of the HTO film 8, resist films 9 are formed on prescribed regions of the HTO film 8.

Figure 5:
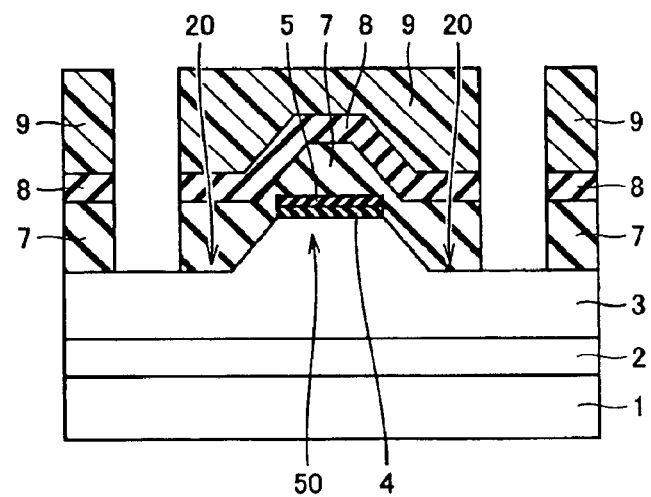

As shown in FIG. 5, the resist films 9 are employed as masks for patterning the HTO film 8 and the HDP-NSG film 7 by dry etching. Thereafter the resist films 9 are removed, thereby obtaining a shape shown in FIG. 6.

Figure 7:
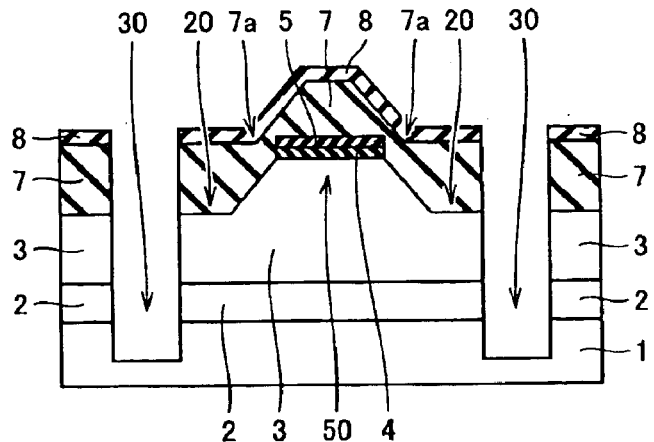

The HTO film 8 and the HDP-NSG film 7 are employed as hard masks for dry-etching the N-type epitaxial silicon layer 3, the N$^+$-type buried layer 2 and the P-type silicon substrate 1, thereby forming deep trenches 30 for isolating the N$^+$-type buried layer 2 as shown in FIG. 7. The thickness of the HTO film 8 is reduced due to the etching for forming the deep trenches 30. The deep trenches 30 are formed to have a depth of about 6 μm from the upper surface of the N-type epitaxial silicon layer 3. The deep trenches 30 are examples of the "second trench" in the present invention.

Figure 6:
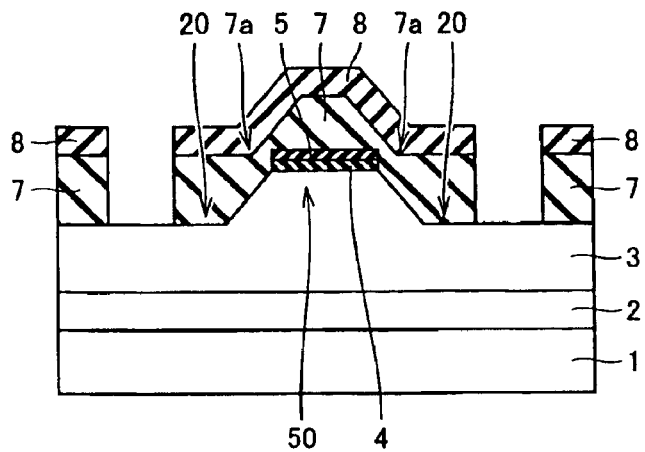
Figure 12:
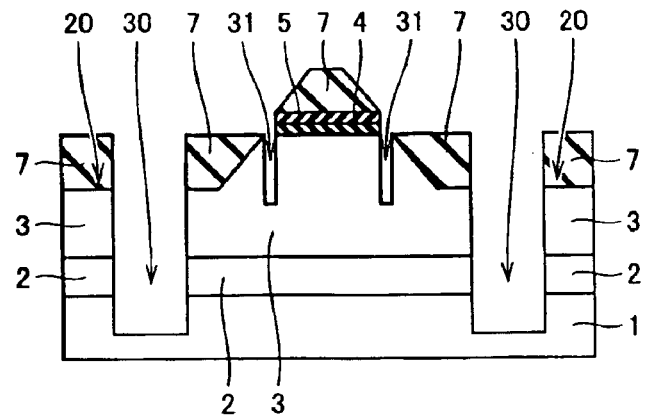
FIG. 12 is a sectional view for illustrating a disadvantage in a case of forming no HTO film in a step of forming deep trenches according to the embodiment shown in FIG. 7.

A disadvantage in a case of forming the deep trenches 30 without forming the HTO film 8 is described with reference to FIGS. 6, 7 and 12. FIG. 12 is a sectional view showing a case of performing etching through only the HDP-NSG film 7 serving as a hard mask without forming the HTO film 8 in the step of forming the deep trenches 30 shown in FIG. 7. The HDP-NSG film 7 having an excellent embedding property and a high deposition rate is an optimum film for filling up the shallow trenches 20. In thickness distribution of the HDP-NSG film 7 formed by repeating deposition and etchback, however, portions 7a (see FIG. 7) located on step portions of the N-type epitaxial silicon layer 3 are disadvantageously extremely reduced in thickness. If the deep trenches 30 are formed by etching through only the HDP-NSG film 7 serving as a hard mask, therefore, the portions 7a of the HDP-NSG film 7 are scraped to partially expose the N-type epitaxial silicon layer 3, disadvantageously leading to formation of slitlike etched portions 31 on the step portions of the N-type epitaxial silicon layer 3 as shown in FIG. 12.

In order to prevent this disadvantage, the HTO film 8 superior in step coverage to the HDP-NSG film 7 is formed on the HDP-NSG film 7 while the HTO film 8 and the HDP-NSG film 7 are employed as hard masks for forming the deep trenches 30 by etching in this embodiment. Thus, no slitlike etched portions 31 shown in FIG. 12 are formed when the deep trenches 30 are formed by etching. According to this embodiment, further, the HTO film 8 is formed with the thickness of at least about 300 nm as hereinabove described, for reliably preventing formation of the slitlike etched portions 31. If the etching selection ratio of the HTO film 8 serving as a mask with respect to Si can be improved when forming the deep trenches 30 by etching, the HTO film 8 can be formed with a thickness smaller than about 300 nm.

Figure 8:
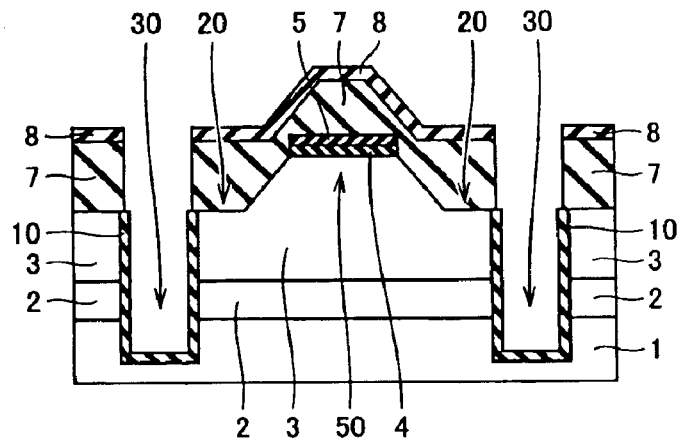

After the step shown in FIG. 7, silicon oxide films (SiO$_2$ films) 10 are formed on the inner surfaces of the deep trenches 30 according to this embodiment, as shown in FIG. 8.

Figure 9:
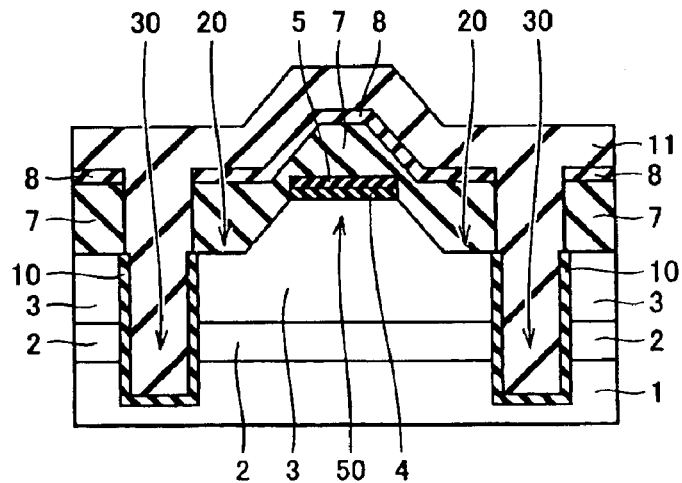

As shown in FIG. 9, a polysilicon film 11 is formed by CVD to fill up the deep trenches 30 while covering the HTO film 8. The polysilicon film 11 is an example of the "embedded film" in the present invention. The silicon oxide films 10 electrically insulate the polysilicon film 11 from the N-type epitaxial silicon layer 3, the N+-type buried layer 2 and the P-type silicon substrate 1.

Figure 10:
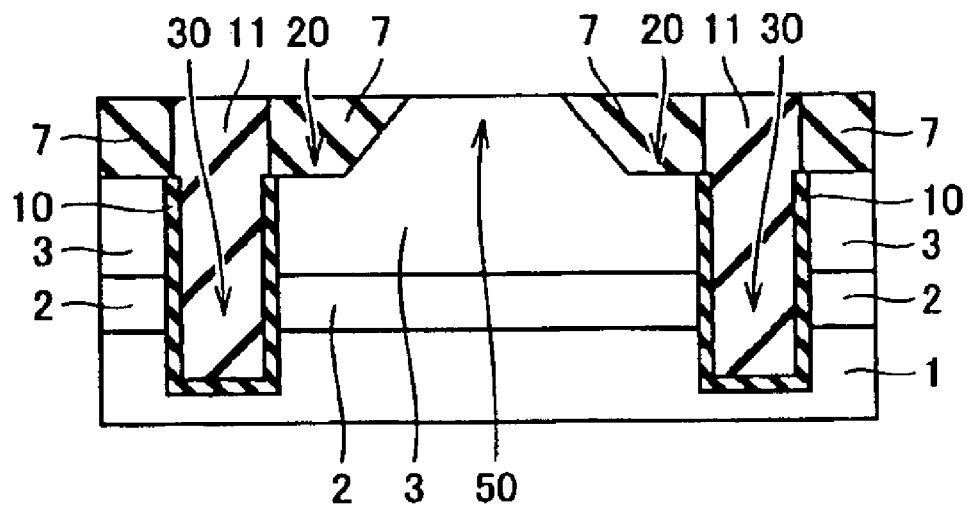

Finally, excess depositional portions of the polysilicon film 11, the HTO film 8 and the HDP-NSG film 7 are simultaneously removed by CMP through the $Si_3N_4$ film 5 serving as a stopper film. Thereafter the $Si_3N_4$ film 5 is removed by phosphoric acid of about 160° C. while the silicon oxide film 4 is removed by dilute hydrofluoric acid. The surface of the HDP-NSG film 7 is also scraped when the silicon oxide film 4 removed, thereby finally forming element isolation regions of the semiconductor device according to this embodiment having flat upper surfaces as shown in FIG. 10.

Figure 11:
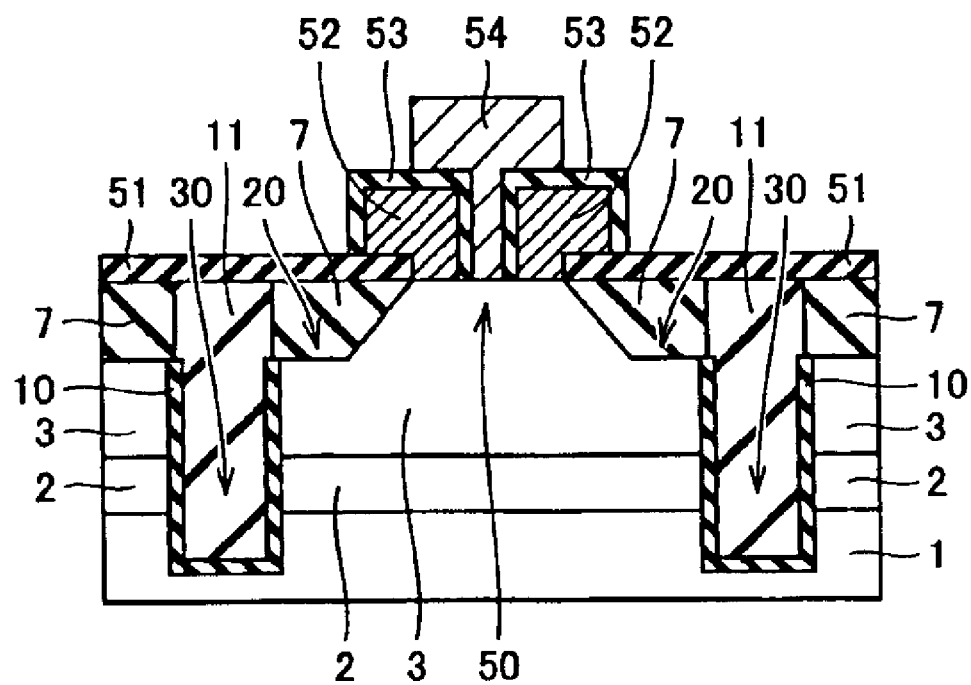

Thereafter insulator films 51 of $SiO_2$ are formed to cover the element isolation regions, as shown in FIG. 11. A base electrode 52, an insulator film 53 of $SiO_2$ covering the base electrode 52 and an emitter electrode 54 are formed on the element forming region 50, thereby forming a bipolar transistor.

According to this embodiment, as hereinabove described, the HDP-NSG film 7 is formed to fill up the shallow trenches 20, the polysilicon films 11 are formed in the deep trenches 30 and the excess depositional portions of the HDP-NSG film 7 and the polysilicon films 11 are simultaneously removed through a single CMP step, whereby the fabrication processes can be simplified as compared with a case of removing the excess depositional portions of the insulator film filling up the shallow trenches 20 and the embedded film filling up the deep trenches 30 through different CMP steps. Further, the high-priced CMP step may be carried out only once, whereby the fabrication cost can be reduced.

According to the aforementioned embodiment, further, the HTO film 8 superior in coverage to the HDP-NSG film 7 is formed on the HDP-NSG film 7 excellent in embedding property but inferior in coverage while the HTO film 8 and the HDP-NSG film 7 are employed as hard masks for forming the deep trenches 30 by etching, whereby it is possible to effectively suppress formation of the slitlike etched portions 31 resulting from the scraped portions 7a of the HDP-NSG film 7 close to the step portions of the N-type epitaxial silicon layer 3 in the step of etching for forming the deep trenches 30. Thus, defective etching can be inhibited.

Although the present invention has been described and illustrated in detail, it is clearly understood that the same is by way of illustration and example only and is not to be taken by way of limitation, the spirit and scope of the present invention being limited only by the terms of the appended claims.

For example, while the HDP-NSG film 7 excellent in embedding property is employed as the insulator film for filling up the shallow trenches 20 in the aforementioned embodiment, the present invention is not restricted to this but another insulator film may alternatively be employed.

While the HTO film 8 is employed as the film excellent in step coverage formed on the HDP-NSG film 7 filling up the shallow trenches 20 in the aforementioned embodiment, the present invention is not restricted to this but another film may alternatively be employed so far as this film has excellent coverage and functions as a hard mask in the step of etching for forming the deep trenches 30. For example, this film may be an $SiO_2$ film, a TEOS film or an $Si_3N_4$ film formed by LP-CVD (low pressure CVD) or AP-CVD (atmospheric pressure CVD) or an SOG film formed by application.

While the polysilicon film 11 is employed for filling up the deep trenches 30 in the aforementioned embodiment, the present invention is not restricted to this but an insulator film may alternatively be employed.

While the HTO film 8 and the HDP-NSG film 7 are employed as hard masks in the step of etching for forming the deep trenches 30 shown in FIG. 7 after removing the resist films 9 in the aforementioned embodiment, the present invention is not restricted to this but the resist films 9, the HTO film 8 and the HDP-NSG film 7 may alternatively be employed as masks for carrying out the etching step without removing the resist films 9. In this case, the thickness of the HTO film 8 can be reduced.

Figure 13:
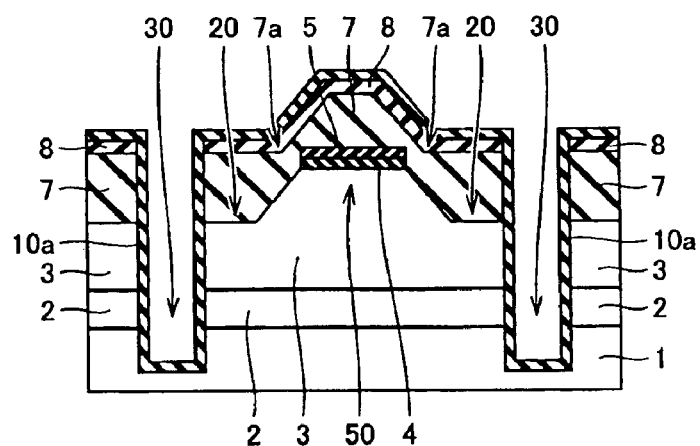
FIGS. 13 to 16 are sectional views for illustrating fabrication processes for a semiconductor device including element isolation regions according to a modification of the embodiment of the present invention.
Figure 14:
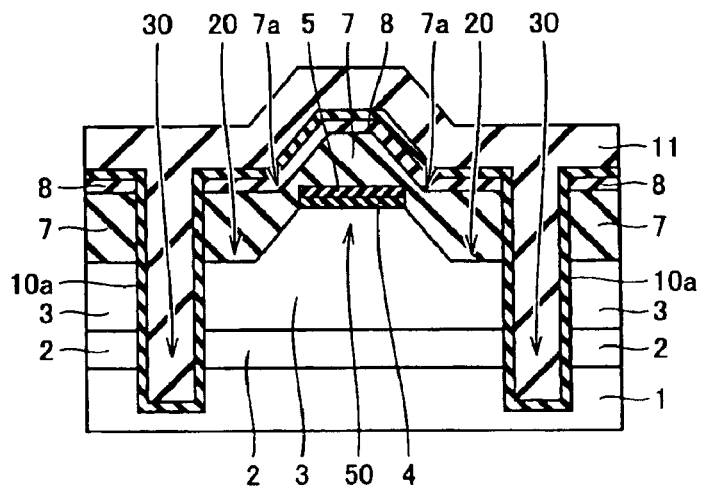
Figure 15:
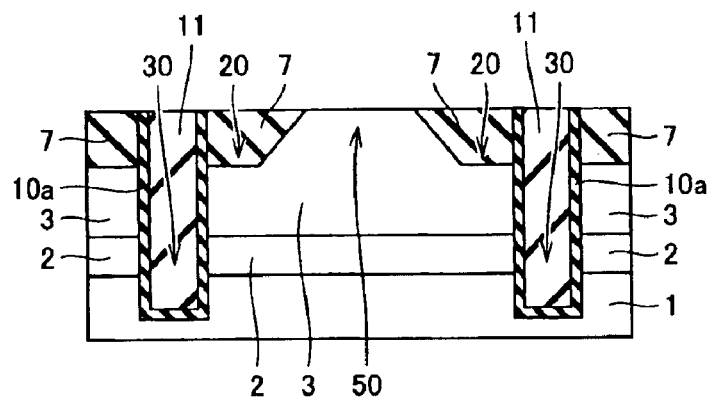
Figure 16:
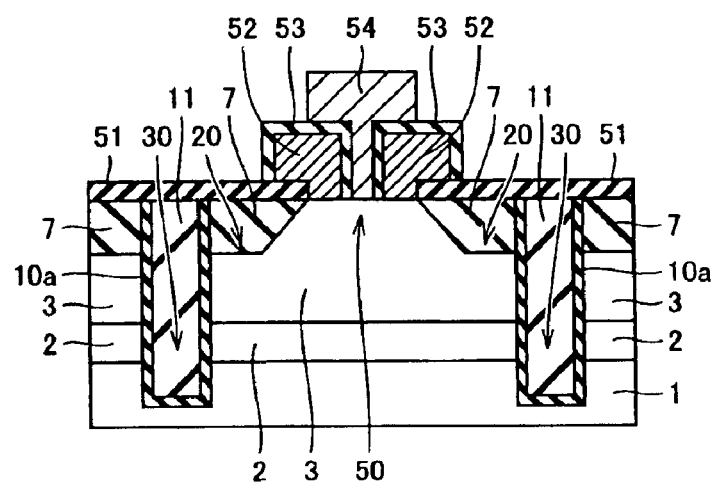
Figure 17:
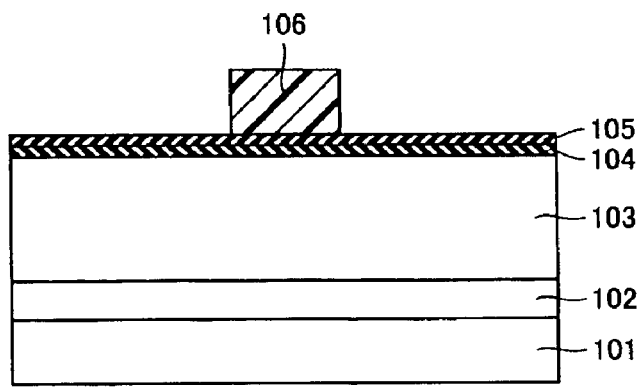
FIGS. 17 to 27 are sectional views for illustrating conventional fabrication processes for a semiconductor device including element isolation regions.
Figure 18:
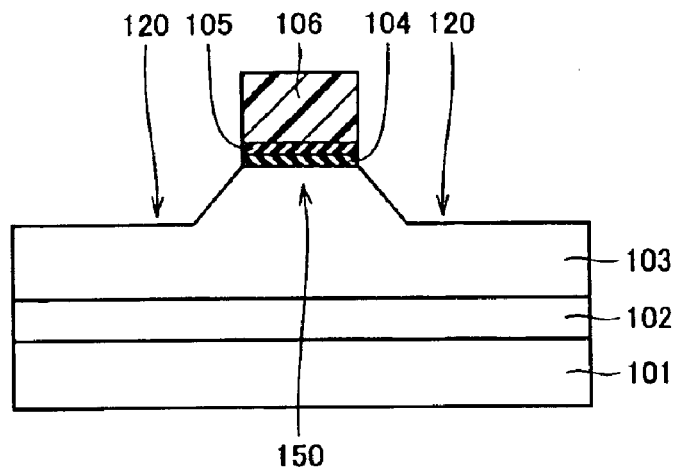
Figure 19:
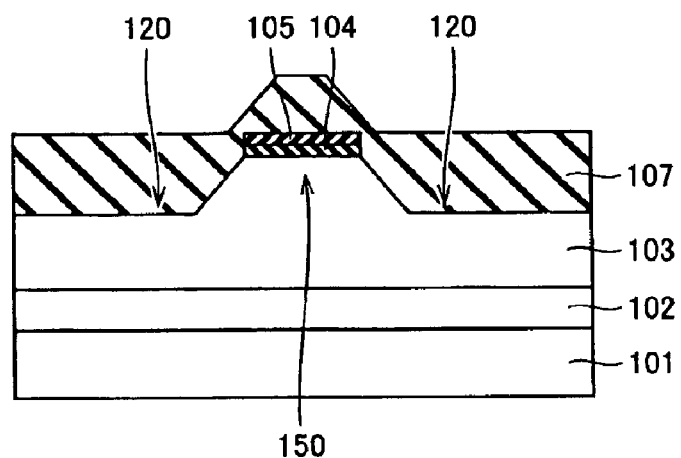
Figure 20:
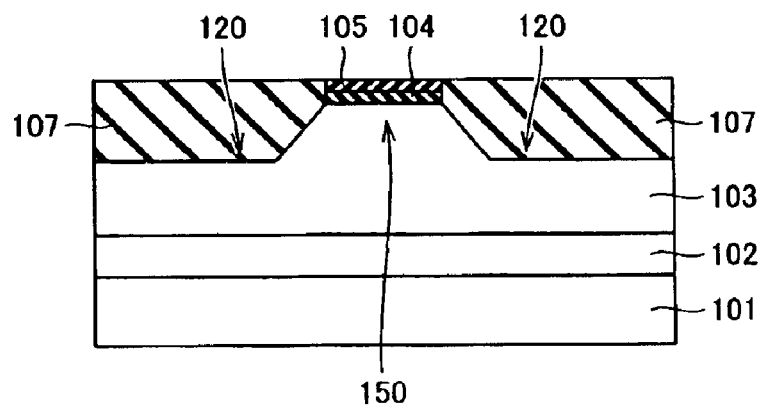
Figure 21:
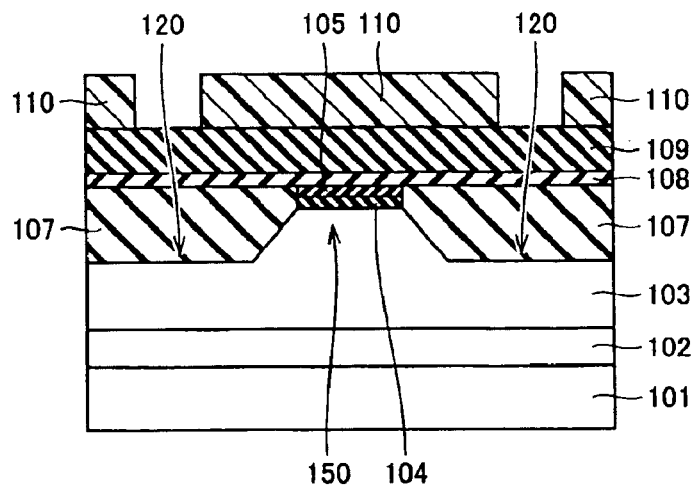
Figure 22:
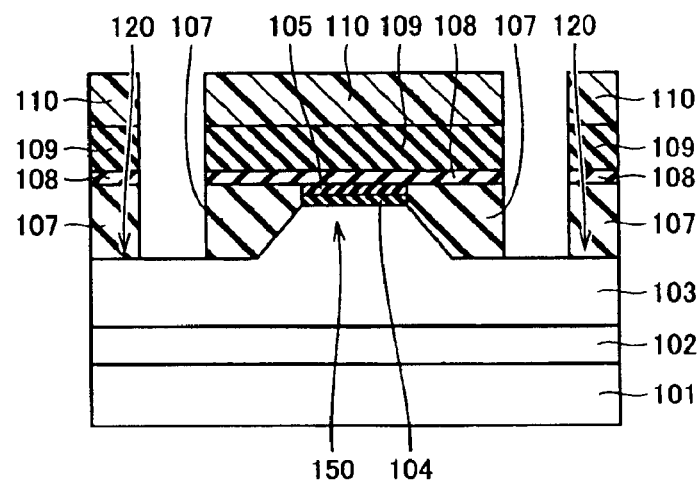
Figure 23:
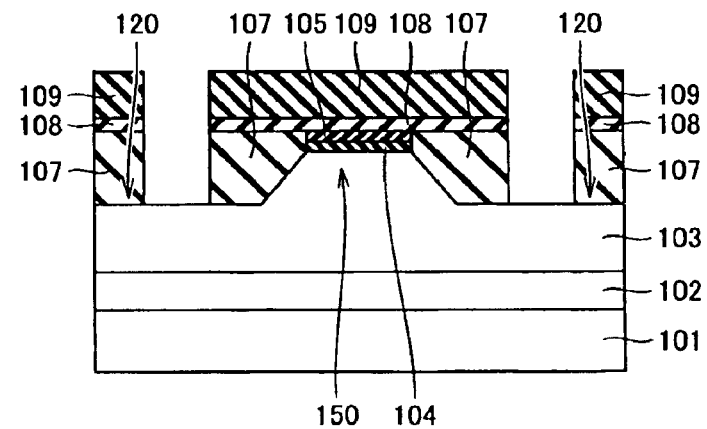
Figure 24:
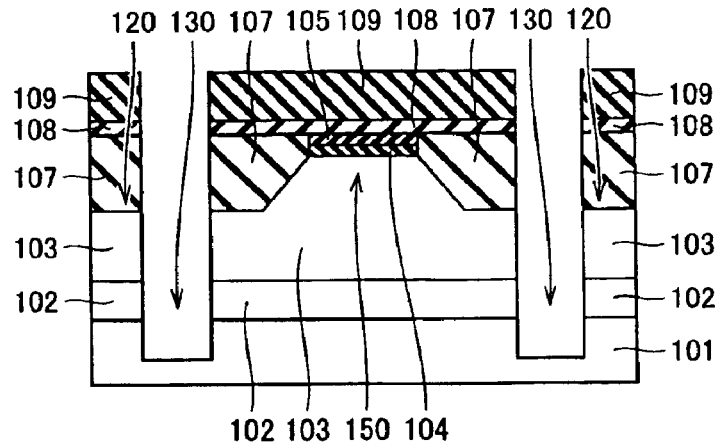
Figure 25:
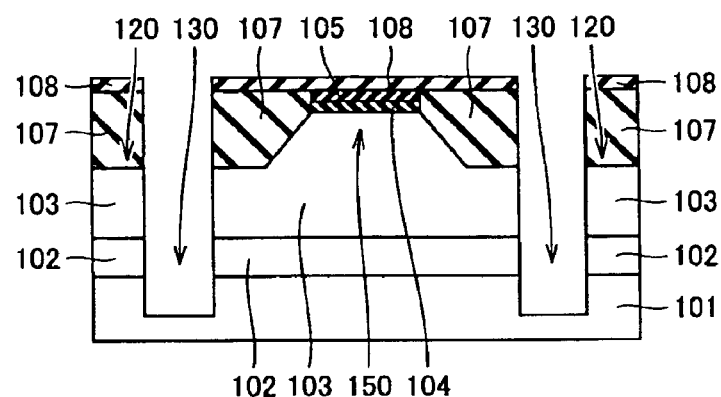
Figure 26:
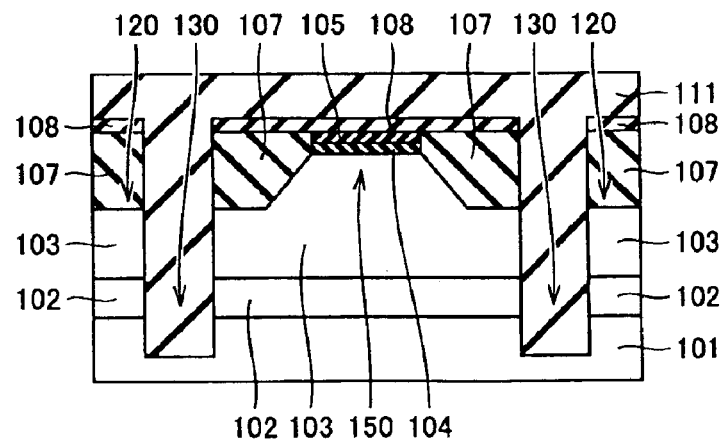
Figure 27:
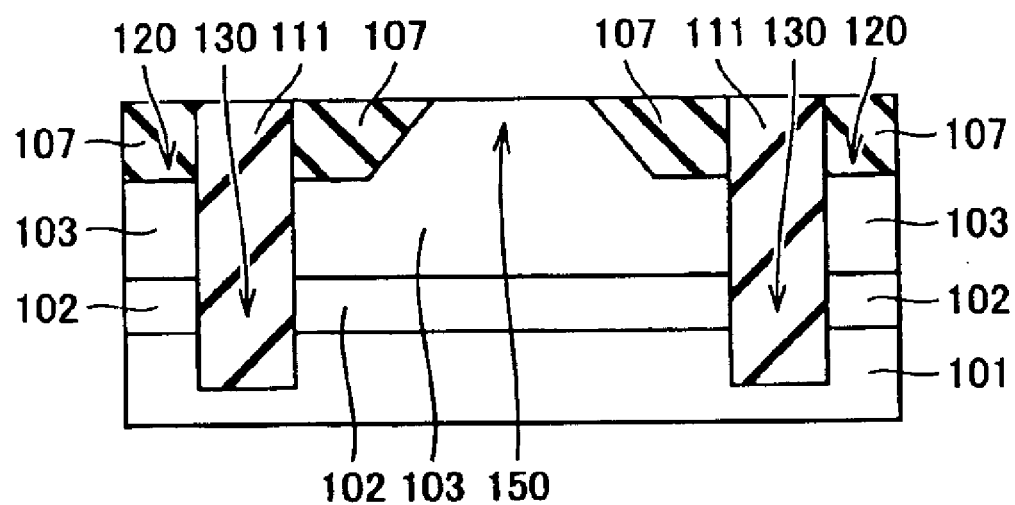

While the silicon oxide films ($SiO_2$ films) 10 are formed on the inner surfaces of the deep trenches 30 constituting second openings by thermal oxidation in the aforementioned embodiment, the present invention is not restricted to this but silicon oxide films ($SiO_2$ films) 10a may alternatively formed on the inner surfaces of deep trenches 30 by CVD, as in a modification of the embodiment shown in FIGS. 13 to 16. According to this modification, the silicon oxide films ($SiO_2$ films) 10a are formed to cover the inner surfaces of the deep trenches 30 and HTO films 8, as shown in FIG. 13. As shown in FIG. 14, a polysilicon film 11 is formed by CVD with a thickness of about 800 nm to fill up the deep trenches 30 while covering the silicon oxide films 10 a. Thereafter a bipolar transistor is formed through fabrication processes shown in FIGS. 15 and 16 similar to those shown in FIGS. 10 and 11. When the silicon oxide films ($SiO_2$ films) 10a are formed on the inner surfaces of the deep trenches 30 by CVD as in this modification, the shapes of shallow trenches (first openings) 20 and the deep trenches (second openings) 30 are not disadvantageously changed due to thermal oxidation dissimilarly to a case of forming the silicon oxide films ($SiO_2$ films) 10a by thermal oxidation.

What is claimed is:

1. A method of fabricating a semiconductor device comprising the steps of:
   forming a first trench on an element isolation region of a semiconductor substrate;
   forming a first film consisting of an insulator film to fill up said first trench;
   forming a second trench larger in depth than said first trench in said first trench;
   forming an embedded film consisting of a semiconductor film in said second trench; and
   substantially simultaneously polishing an excess depositional portion of said first film and an excess depositional portion of said embedded film.

2. The method of fabricating a semiconductor device according to claim 1, wherein
   said step of forming said first film includes a step of forming said first film consisting of an insulator film by high density plasma CVD.

3. The method of fabricating a semiconductor device according to claim 1, further comprising a step of forming a first insulator film on the inner surface of said second trench in advance of said step of forming said embedded film in said second trench.

4. The method of fabricating a semiconductor device according to claim 3, wherein
   said step of forming said first insulator film includes a step of forming said first insulator film by CVD.

5. The method of fabricating a semiconductor device according to claim 1, further comprising a step of forming a second insulator film covering said element isolation region after said step of substantially simultaneously polishing said excess depositional portion of said first film and said excess depositional portion of said embedded film.

6. The method of fabricating a semiconductor device according to claim 1, further comprising a step of forming a semiconductor element on an element forming region enclosed with said element isolation region.

7. The method of fabricating a semiconductor device according to claim 1, wherein the semiconductor film is a polysilicon film.

8. A method of fabricating a semiconductor device comprising steps of:

forming a first trench in an element isolation region of a semiconductor substrate;

forming a first film consisting of an insulator film to fill up said first trench;

forming a second film superior in coverage to said first film on said first film;

forming a second trench larger in depth than said first trench in said first trench;

forming an embedded film in said second trench;

substantially simultaneously polishing an excess depositional portion of said first film and an excess depositional portion of said embedded film; wherein said step of forming said second trench includes a step of etching said semiconductor substrate through said second film and said first film serving as masks thereby forming said second trench larger in depth than said first trench in said first trench.

9. The method of fabricating a semiconductor device according to claim 8, wherein said second film is an HTO film.

10. The method of fabricating a semiconductor device according to claim 8, wherein said step of forming said second trench includes steps of:

forming a resist film on a prescribed region of said second film and thereafter patterning said second film and said first film through said resist film serving as a mask, and removing said resist film and thereafter etching said semiconductor substrate through patterned said second film and patterned said first film serving as masks thereby forming said second trench larger in depth than said first trench in said first trench.

11. The method of fabricating a semiconductor device according to claim 10, wherein said step of forming said second trench includes a step of etching said semiconductor substrate while leaving said second film by a prescribed thickness thereby forming said second trench larger in depth than said first trench in said first trench.

12. The method of fabricating a semiconductor device according to claim 11, wherein said second film has a thickness of at least 300 nm and not more than 500 nm.

13. The method of fabricating a semiconductor device according to claim 8, wherein said step of forming said second trench includes steps of:

forming a resist film on a prescribed region of said second film and thereafter patterning said second film and said first film through said resist film serving as a mask, and etching said semiconductor substrate through said resist film, patterned said second film and patterned said first film serving as masks thereby forming said second trench larger in depth than said first trench in said first trench.

14. The method of fabricating a semiconductor device according to claim 8, wherein said first film is superior in embedding property to said second film.

15. The method of fabricating a semiconductor device according to claim 8, wherein said step of forming said second film includes a step of forming said second film superior in coverage to said first film by a method other than high density plasma CVD.

16. The method of fabricating a semiconductor device according to claim 15, wherein said step of forming said second film includes a step of forming an HTO film by low pressure CVD.

* * * * *